(12) United States Patent
Kim

(10) Patent No.: US 9,558,921 B2
(45) Date of Patent: Jan. 31, 2017

(54) MAGNETRON SPUTTERING APPARATUS

(71) Applicant: SAMSUNG DISPLAY CO., LTD., Yongin, Gyeonggi-Do (KR)

(72) Inventor: Jong Yun Kim, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/748,648

(22) Filed: Jun. 24, 2015

(65) Prior Publication Data

US 2016/0203961 A1    Jul. 14, 2016

(30) Foreign Application Priority Data

Jan. 14, 2015  (KR) .......................... 10-2015-0007028

(51) Int. Cl.
  *C23C 14/34*    (2006.01)
  *H01J 37/34*    (2006.01)

(52) U.S. Cl.
  CPC .......... *H01J 37/3405* (2013.01); *H01J 37/345* (2013.01); *H01J 37/3417* (2013.01); *H01J 37/3447* (2013.01); *H01J 37/3455* (2013.01)

(58) Field of Classification Search
  CPC ... C23C 14/35; H01J 37/3402; H01J 37/3405; H01J 37/3441; H01J 37/3447; H01J 37/3452; H01J 37/3455; H01J 37/3461

USPC .............. 204/298.21, 298.22, 298.2, 298.11
See application file for complete search history.

(56) References Cited

U.S. PATENT DOCUMENTS

| | | | | |
|---|---|---|---|---|
| 5,108,574 A | * | 4/1992 | Kirs | .................... H01J 37/3441 |
| | | | | 204/192.12 |
| 5,262,032 A | * | 11/1993 | Hartig | ................. C23C 14/3407 |
| | | | | 204/192.12 |
| 2005/0034981 A1 | * | 2/2005 | Fuchs | ................. C23C 14/3407 |
| | | | | 204/298.21 |
| 2009/0200158 A1 | | 8/2009 | Ehiasarian | |

FOREIGN PATENT DOCUMENTS

| | | |
|---|---|---|
| KR | 10-2001-0001581 A | 1/2001 |
| KR | 10-2008-0042172 A | 5/2008 |
| KR | 10-2010-0049649 A | 5/2010 |

* cited by examiner

*Primary Examiner* — Rodney McDonald
(74) *Attorney, Agent, or Firm* — Lee & Morse, P.C.

(57) ABSTRACT

A magnetron sputtering apparatus includes a vacuum chamber, a cathode target that rotates on the outer side of a backing plate in the vacuum chamber, a magnetic circuit that is spaced from the outer side of the cathode target and defines an opening through which a plasma including a target material removed from the cathode target is ejected, and a yoke around the outer side of the cathode target, the yoke supporting the magnetic circuit.

7 Claims, 4 Drawing Sheets

MAGNETRON SPUTTERING APPARATUS

CROSS-REFERENCE TO RELATED APPLICATION

Korean Patent Application No. 10-2015-0007028, filed on Jan. 14, 2015, in the Korean Intellectual Property Office, and entitled: "Magnetron Sputtering Apparatus," is incorporated by reference herein in its entirety.

BACKGROUND

1. Field

Embodiments relate to a magnetron sputtering apparatus with a magnetic circuit and a cathode target.

2. Description of the Related Art

In general, according to methods that form a layer using sputtering, ions (for example, argon ions) are sputtered to a target material in vacuum and a material removed off the target material due to the sputtered ions sticks to a substrate opposite the target material, thereby forming a layer.

SUMMARY

Embodiments are directed to a magnetron sputtering apparatus including a vacuum chamber, a cathode target that rotates on the outer side of a backing plate in the vacuum chamber, a magnetic circuit that is spaced from the outer side of the cathode target and defines an opening through which a plasma including a target material removed from the cathode target is ejected, and a yoke around the outer side of the cathode target, the yoke supporting the magnetic circuit.

The magnetic circuit may include a first magnet and a second magnet spaced from and facing each other with the opening therebetween.

The first magnet and the second magnet may be elongated in a longitudinal direction of the cathode target, with the gap of the opening maintained in the longitudinal direction.

The apparatus may further include a target driving motor connected to the cathode target to rotate the cathode target and a yoke wobbling motor connected to the yoke to wobble the yoke forward and backward.

Cooling water may be supplied inside the backing plate.

The apparatus may further include a ground shield disposed around the outer side of the magnetic circuit and covering the magnetic circuit.

The ground shield may include a first shield member covering the first magnet and fixed to the yoke, and a second shield member covering the second magnet and fixed to the yoke.

The opening defined by the first magnet and the second magnet may be in a range of 60 to 120 degrees relative to a central axis of the apparatus.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
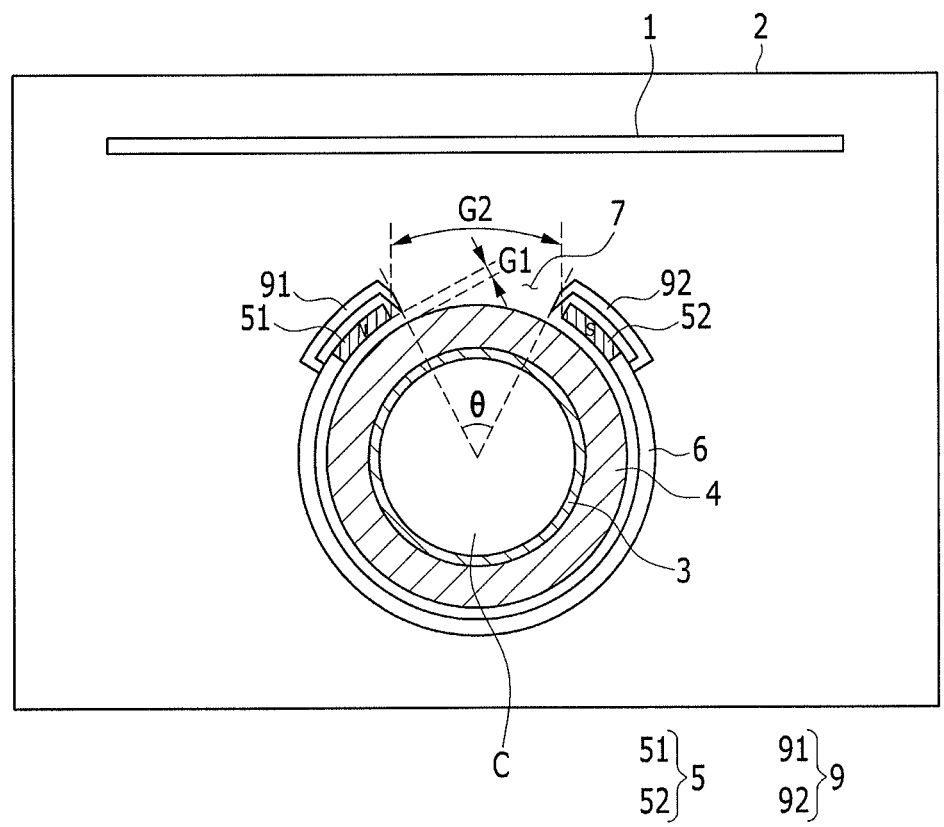
FIG. 1 illustrates a schematic diagram depicting a magnetron sputtering apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

FIG. 1 illustrates a schematic diagram of a magnetron sputtering apparatus according to an exemplary embodiment. Referring to FIG. 1, the magnetron sputtering apparatus may include a vacuum chamber 2 that receives a substrate 1 to be sputtered in a vacuum state, a cathode target 4 that rotates on the outer side of a backing plate 3 in the vacuum chamber 2, and a magnetic circuit 5 (see FIG. 2) and a yoke 6 that are disposed around the cathode target 4.

The cathode target 4 may include a target material for forming a thin film on the substrate 1. The cathode target 4 may be connected to a power source to pull argon ions (plus ions) such that the argon ions hit against the cathode target 4. For example, the cathode target 4 may be connected to a part with negative potential and the vacuum chamber 2 may be connected to a ground with positive potential.

Accordingly, plasma including the target material removed off the cathode target 4 may be produced by the potential difference between the cathode target 4 and the vacuum chamber 2. The target material removed from the cathode target and included from the plasma may be sputtered to the substrate 1.

Figure 2:
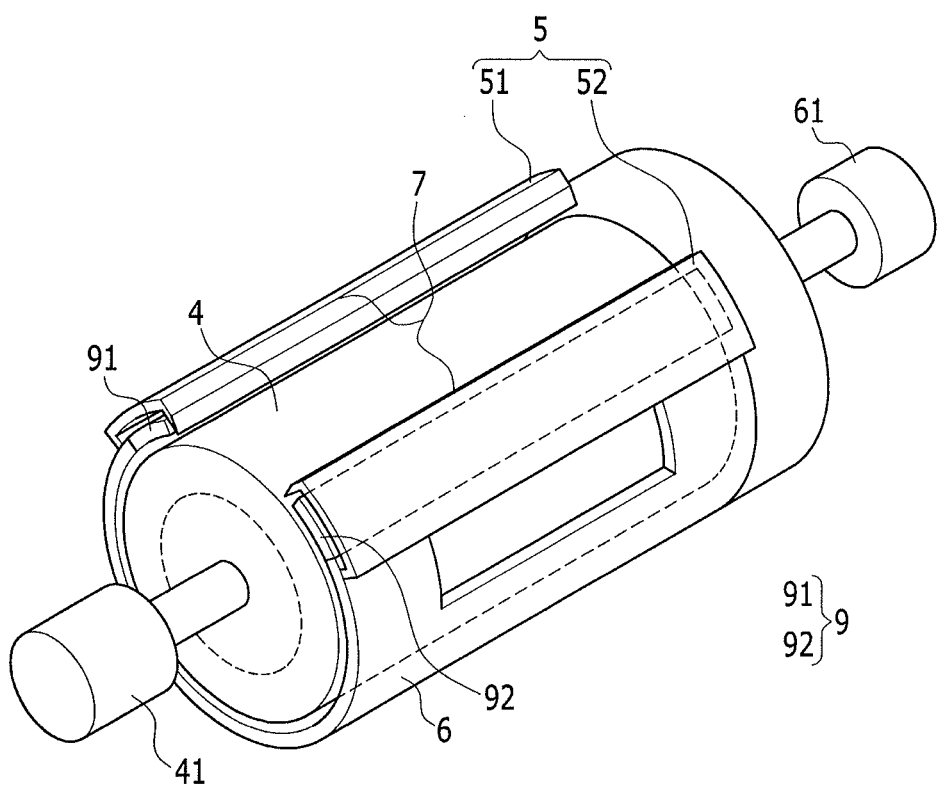
FIG. 2 illustrates a perspective view depicting a cathode target and a magnetic circuit that are applied to the apparatus illustrated in FIG. 1.

FIG. 2 illustrates a perspective view depicting a cathode target and a magnetic circuit included in the apparatus illustrated in FIG. 1. Referring to FIGS. 1 and 2, the magnetic circuit 5 may be spaced with a first gap G1 from around the outer side of the cathode target 4 and may define an opening 7 through which a plasma including the target material removed from the cathode target 4 is ejected.

For example, the magnetic circuit 5 may include a first magnet 51 and a second magnet 52 that are spaced from each other with a second gap G2 at the opening 7. The first magnet 51 and the second magnet 52 may control ion bombardment against the cathode target 4.

The first and second magnets 51 and 52 may be permanent magnets. The first and second magnets 51 and 52 may be elongated in the longitudinal direction of the cathode target 4, with the second gap G2 of the opening 7 maintained. Accordingly, the first and second magnets 51 and 52 may control ion bombardment at the opening 7 and may increase the density of plasma including the target material removed off the cathode target 4.

When a thin film is formed on the substrate, the cathode target 4 may rotate at a predetermined speed and the magnetic circuit 5 may alternately revolve clockwise and counterclockwise. For this purpose, a target driving motor 41 may be connected to the cathode target 4 and a yoke wobbling motor 61 is connected to the yoke 6.

FIG. 2 illustrates an example of a structure with the target driving motor 41 and the yoke wobbling motor 61. The cathode target and the yoke may be driven by various power transmission structures.

The magnetron sputtering apparatus of an exemplary embodiment may rotate the cathode target 4 at a predetermined speed by operating the target driving motor 41 and may wobble the yoke 6 and the magnetic circuit 5 clockwise and counterclockwise by operating the yoke wobbling motor 61.

The yoke 6 may be spaced around the outer side of the cathode target 4 and may support the magnetic circuit 5. Accordingly, the yoke 6 may be positioned so as to not interfere with rotation of the cathode target 4. The first and second magnets 51 and 52 may be fixed to the yoke 6, with the first gap G1 of the first and second magnets 51 and 52 from the cathode target 4 and the second gap G2 of the first and second magnets 51 and 52 from each other maintained.

Accordingly, regardless of rotation at a predetermined speed of the cathode target 4, the yoke 6 may be operated and may wobble the first and second magnets 51 and 52 clockwise and counterclockwise. The opening 7 defined by the magnetic circuit 5 may allow the base material to be removed off the cathode target 4 while wobbling in respect to the substrate 1.

The angle Θ of the opening 7 defined by the first and second magnets 51 and 52 relative to a central axis of the magnetron sputtering apparatus may be set in the range of 60 to 120 degrees. When power is applied to the cathode target 4 with the vacuum chamber 2 grounded, an electric field may be generated at the opening 7 in the radial direction of the cathode target 4 and a magnetic field may be generated between the first and second magnets 51 and 52.

If the angle Θ of the opening is less than 60 degrees, the area where plasma including a target material is produced may be too small, such that the amount of the plasma including the target material removed from the cathode target may be too small. If the angle Θ of the opening 7 is larger than 120 degrees, the area where plasma including a target material is produced may be too large, such that the components in a magnetic field that are perpendicular to an electric field may be reduced.

When the angle Θ of the opening 7 is in the range of 60 to 120 degrees, a sufficient amount of plasma including target base material removed from the cathode target 4 may be ejected and the components in an electric filed that are perpendicular to an electric filed may be maximized. The density of the plasma in the traveling direction of a target material removed off the cathode target 4 and ejected through the opening 7 may be increased.

The magnetron sputtering apparatus of an exemplary embodiment may further include a ground shield 9 around the outer side of the magnetic circuit to prevent a target material removed off the cathode target 4 from forming a film on the magnetic circuit 5. The ground shield 9 may cover the magnetic circuit 5.

For example, the ground shield 9 may include a first shield member 91 covering the first magnet 51 and fixed to a side of the yoke 6 and a second shield member 92 covering the second magnet 52 and fixed to another side of the yoke 6. The opening 7 may be set as the gap between the first and second shield members 91 and 92.

When the first and second shield members 91 and 92 are provided, some of the target material that is ejected in the plasma, and that travels back to the first and second magnets 51 and 52 may stick to the first and second shield members 91 and 92. The first and second magnets 51 and 52 may be protected from a film being formed by the target material.

The cathode target 4 may be disposed around the outer side of the backing plate 3. Cooling water C may be supplied inside the backing plate 3. The cooling water C may prevent the cathode target 4 from overheating.

The magnetic circuit 5 may be disposed around the outer side of the cathode target 4. Accordingly, the structure for supplying cooling water C inside the backing plate 3 may be simplified. Further, the first and second magnets 51 and 52 may be disposed around the outer side of the cathode target 4. Accordingly, it may be easy to adjust the intensity of a magnetic field.

In addition, it may be possible to increase the intensity of a magnetic field by attaching a piece of a magnet to the outer sides of the first and second magnets or to decrease the intensity of a magnetic field by attaching a piece of stainless steel to the outer sides of the first and second magnets.

Figure 3:
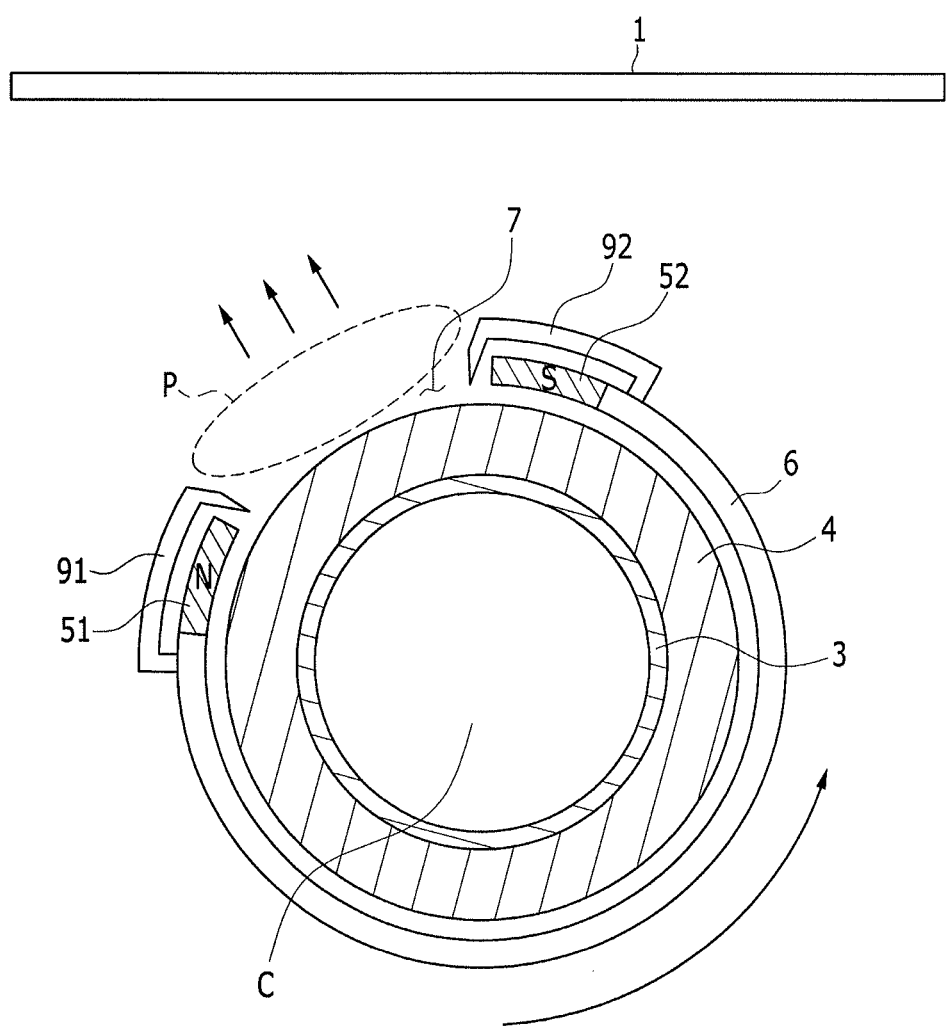
FIG. 3 illustrates a view depicting a yoke rotating counterclockwise.
Figure 4:
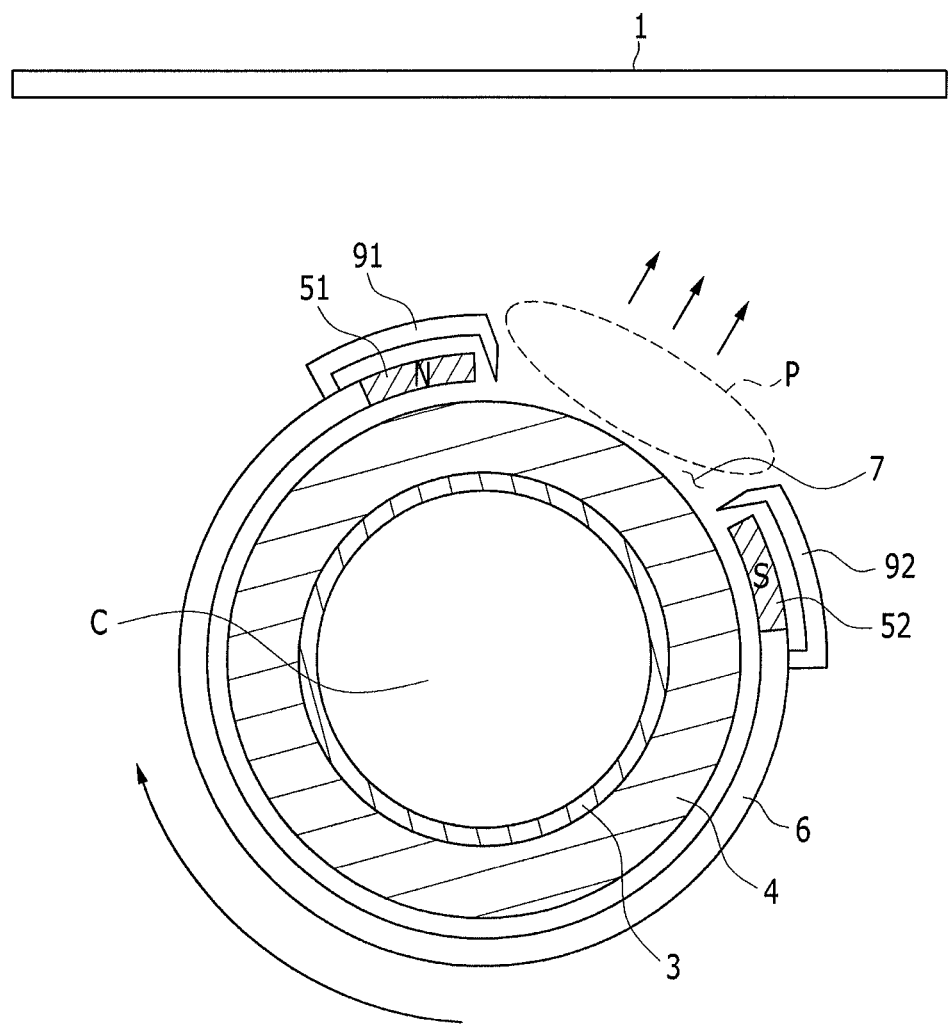
FIG. 4 illustrates a view depicting the yoke rotating clockwise.

FIG. 3 illustrates the yoke rotating counterclockwise and FIG. 4 illustrates the yoke rotating clockwise. Referring to FIGS. 3 and 4, the magnetron sputtering apparatus of an exemplary embodiment may rotate the cathode target 4 at a predetermined speed by operating the target driving motor 41 and may wobble the first and second magnets 51 and 52 clockwise and counterclockwise by operating the yoke wobbling motor 61.

The cathode target 4 may be connected to a power (negative potential) and the vacuum chamber 2 may be grounded (positive potential). Accordingly, argon ions may hit against the cathode target 4 through the opening 7 and plasma P including a material removed off the cathode target 4 may be produced accordingly.

The target material ejected with the plasma P may be sputtered to the substrate 1 through the opening 7 defined by the first and second magnets 51 and 52, which moves regardless of the rotation of the cathode target 4.

The magnetron sputtering apparatus of an exemplary embodiment may change the direction of the opening with respect to the substrate 1 by revolving the yoke 6. Accordingly, it may be possible to achieve a uniform film on the substrate with a minimum number of moving parts.

By way of summation and review, a magnetron sputtering apparatus may include a pipe-shaped cathode target on a backing plate, a cooling water jacket inside the backing plate, and a magnetic circuit disposed in the cooing water jacket and controlling ion bombardment by generating a magnetic field around the cathode target. In order to achieve a uniform layer, the magnetic circuit may be wobbled to the left and right to minimize production of particles by reducing the moving parts. Such a magnetron sputtering apparatus may include the cooling water jacket inside the backing plate and the magnetic circuit in the cooling water jacket. However, it may be complicated to install the magnetic circuit and may be difficult to adjust the intensity of a magnetic field. Further, a power source (negative potential) may be connected to the cathode target and a vacuum chamber may be grounded to 0V (positive potential), such an electric field is generated in the radial direction of the cathode target. When the magnetic circuit is disposed in the backing plate or in the cooling water jacket, the amount of components in the magnetic field that are perpendicular to the electric field that be small. Therefore, the density of plasma including the material removed off the cathode target is low in the traveling direction of the target material.

Embodiments provide a magnetron sputtering apparatus having advantages of increasing the density of plasma, which includes a material removed off a cathode target, in the traveling direction of the target material. The magnetic circuit may be disposed around the outer side of a cathode target, such that a plasma including a target material ejected from the cathode target, and accordingly, the components in a magnetic field that are perpendicular to an electric field, can be increased. The density of plasma including the target material removed off the cathode target may be increased in the traveling direction of the target material. When the magnetic circuit is disposed around the outer side of the cathode target, it may be easy to install the magnetic circuit and adjust the intensity of a magnetic field.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof the present invention as set forth in the following claims.

What is claimed is:

1. A magnetron sputtering apparatus, comprising:
   a vacuum chamber;
   a cathode target that rotates on the outer side of a backing plate in the vacuum chamber;
   a yoke around the outer side of the cathode target, the yoke supporting a first magnet and a second magnet that are spaced apart from and face each other such that an opening through which a plasma including a target material removed from the cathode target is ejected is defined between the first magnet and the second magnet, and the first magnet and second magnet providing a magnetic circuit that is spaced from the outer side of the cathode target;
   a target driving motor connected to the cathode target to rotate the cathode target; and
   a yoke wobbling motor connected to the yoke to wobble both the yoke and the first magnet and second magnet supported by the yoke together in a clockwise and a counterclockwise direction.

2. The apparatus as claimed in claim 1, wherein the first magnet and the second magnet are elongated in a longitudinal direction of the cathode target, with the gap of the opening maintained in the longitudinal direction.

3. The apparatus as claimed in claim 1, wherein cooling water is supplied inside the backing plate.

4. The apparatus as claimed in claim 1, further comprising a ground shield disposed around the outer side of the magnetic circuit and covering the magnetic circuit.

5. The apparatus as claimed in claim 4, wherein the ground shield includes:
   a first shield member covering the first magnet and fixed to the yoke; and
   a second shield member covering the second magnet and fixed to the yoke.

6. The apparatus as claimed in claim 1, wherein the opening defined by the first magnet and the second magnet is in a range of 60 to 120 degrees relative to a central axis of the apparatus.

7. The apparatus as claimed in claim 1, wherein the first magnet and second magnet provide a magnetic circuit that is entirely spaced from the outer side of the cathode target.

* * * * *